United States Patent
Eto

(10) Patent No.: US 10,115,615 B2
(45) Date of Patent: Oct. 30, 2018

(54) SUBSTRATE PROCESSING APPARATUS AND CONTROL METHOD OF SUBSTRATE PROCESSING APPARATUS

(71) Applicant: Toshiba Memory Corporation, Minato-ku (JP)

(72) Inventor: Hideo Eto, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 248 days.

(21) Appl. No.: 15/219,708

(22) Filed: Jul. 26, 2016

(65) Prior Publication Data

US 2017/0263477 A1 Sep. 14, 2017

(30) Foreign Application Priority Data

Mar. 11, 2016 (JP) ................................. 2016-048526

(51) Int. Cl.
| | |
|---|---|
| H01L 21/67 | (2006.01) |
| H01L 21/687 | (2006.01) |
| H01L 21/683 | (2006.01) |
| G05B 19/418 | (2006.01) |
| H01J 37/32 | (2006.01) |
| B08B 13/00 | (2006.01) |
| B08B 5/04 | (2006.01) |
| B24C 1/00 | (2006.01) |

(52) U.S. Cl.
CPC .......... *H01L 21/67196* (2013.01); *B08B 5/04* (2013.01); *B08B 13/00* (2013.01); *B24C 1/003* (2013.01); *G05B 19/41805* (2013.01); *H01J 37/32009* (2013.01); *H01L 21/67069* (2013.01); *H01L 21/67201* (2013.01); *H01L 21/67276* (2013.01); *H01L 21/6833* (2013.01); *H01L 21/68707* (2013.01); *H01L 21/68735* (2013.01); *G05B 2219/45031* (2013.01); *H01J 2237/334* (2013.01)

(58) Field of Classification Search
None
See application file for complete search history.

(56) References Cited

U.S. PATENT DOCUMENTS

| | | | |
|---|---|---|---|
| 5,474,643 A | 12/1995 | Arami et al. | |
| 6,614,050 B1 | 9/2003 | Yamada et al. | |
| 2006/0218680 A1* | 9/2006 | Bailey, III | ................ B08B 1/00 414/217 |
| 2007/0005045 A1 | 1/2007 | Mintz et al. | |
| 2009/0030428 A1 | 1/2009 | Omori et al. | |
| 2012/0059390 A1 | 3/2012 | Mintz et al. | |
| 2013/0084156 A1 | 4/2013 | Shimamoto et al. | |

(Continued)

FOREIGN PATENT DOCUMENTS

| | | |
|---|---|---|
| JP | 5-144925 | 6/1993 |
| JP | 7-142549 | 6/1995 |
| JP | 2996491 | 12/1999 |

(Continued)

*Primary Examiner* — Paul B Yanchus, III
(74) *Attorney, Agent, or Firm* — Oblon, McClelland, Maier & Neustadt, L.L.P.

(57) ABSTRACT

According to one embodiment, there is provided a substrate processing apparatus including a processing unit and a manipulator. The processing unit processes a substrate. The manipulator is for maintenance. The manipulator is placed near the processing unit.

11 Claims, 8 Drawing Sheets

(56) References Cited

U.S. PATENT DOCUMENTS

2015/0194325 A1* 7/2015 Yang ................. H01L 21/67028
                                                                   134/37
2017/0341224 A1* 11/2017 Hashimoto ................ B25J 9/06

FOREIGN PATENT DOCUMENTS

| JP | 2001-196283 | 7/2001 |
|----|-------------|--------|
| JP | 2009-38328  | 2/2009 |
| JP | 2009-45428  | 3/2009 |
| JP | 2012-61351  | 3/2012 |
| JP | 5525339     | 6/2014 |

* cited by examiner

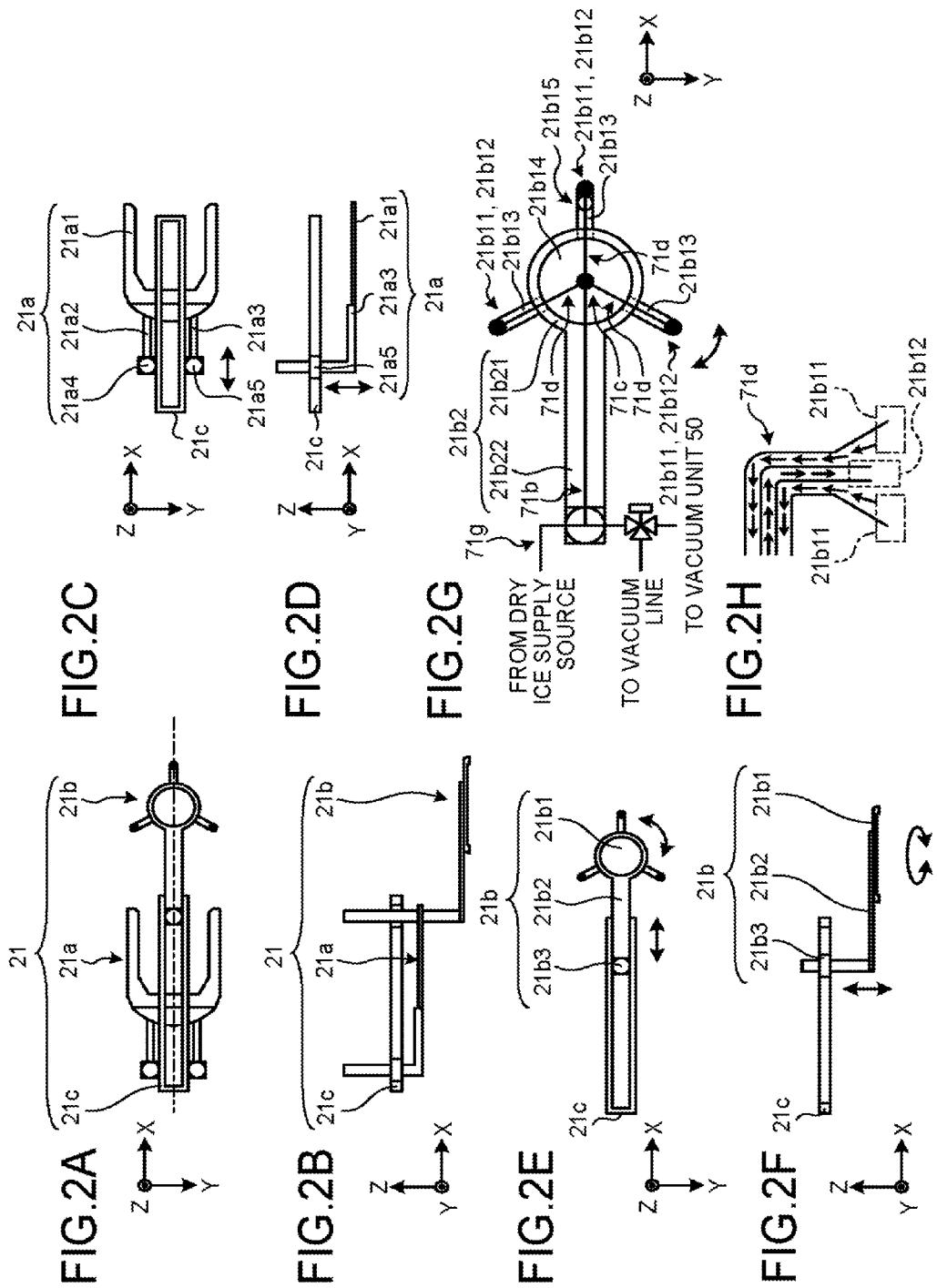

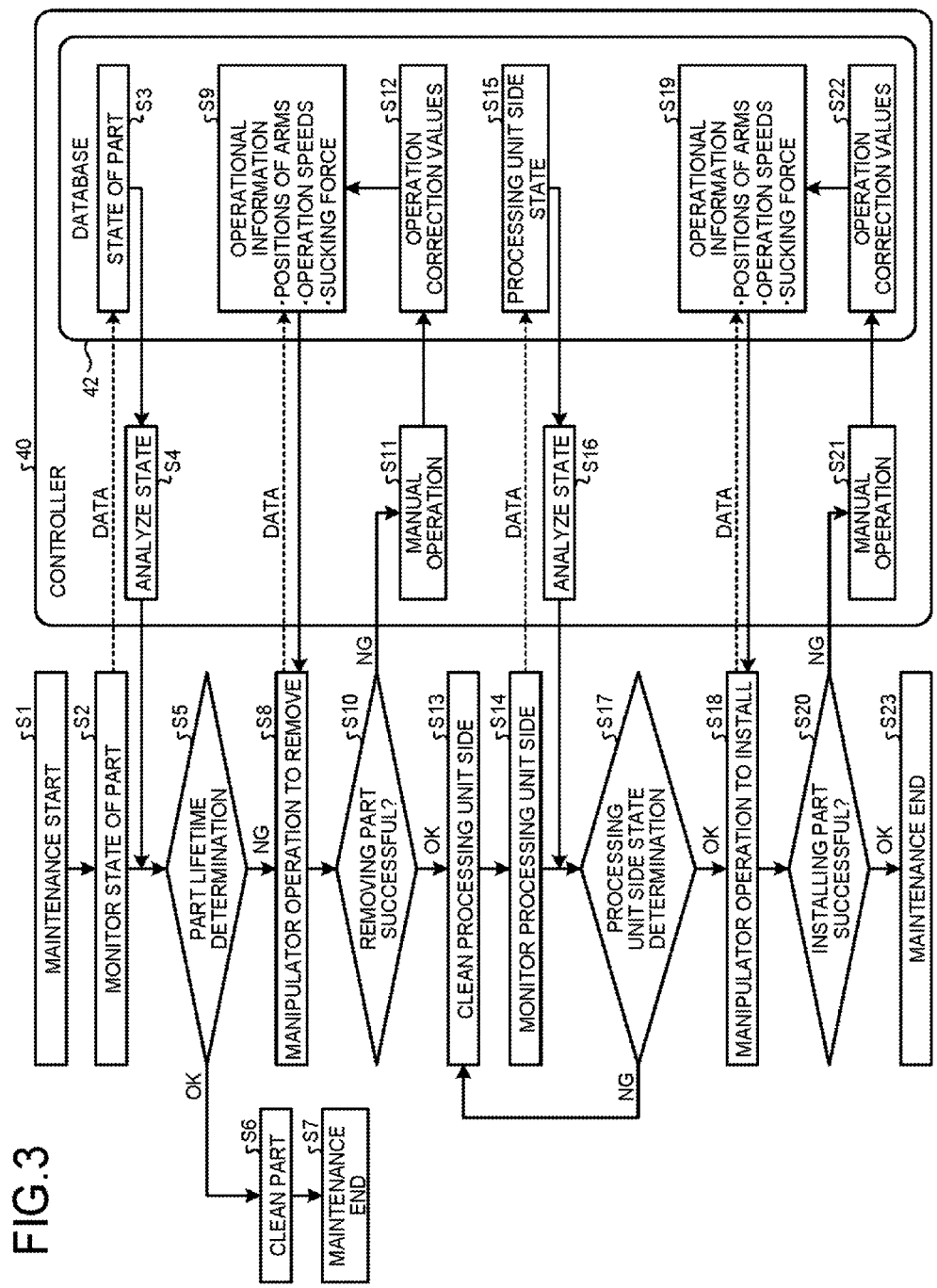

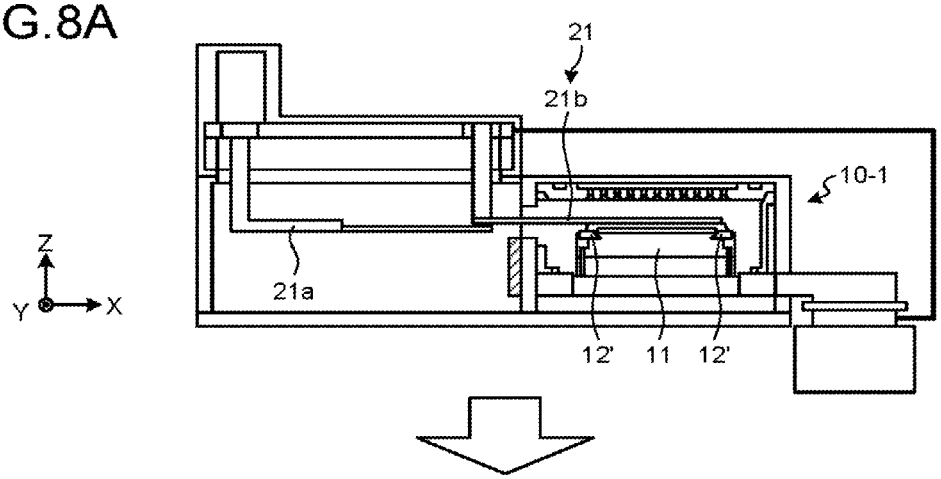
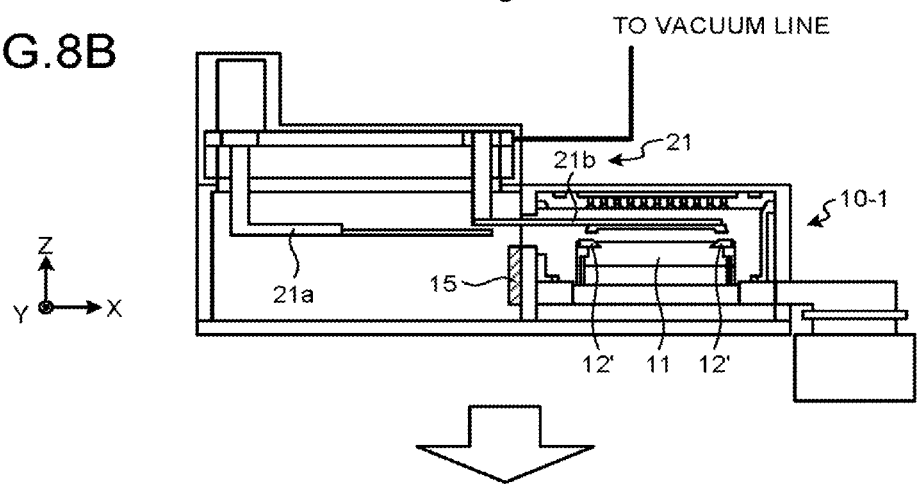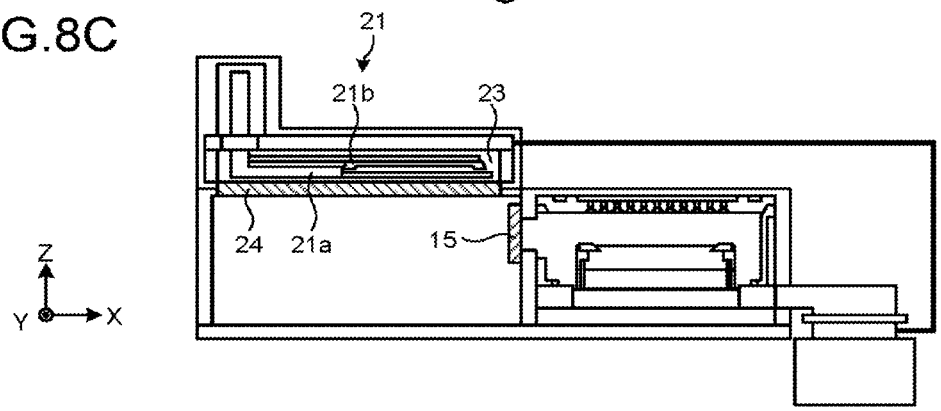

SUBSTRATE PROCESSING APPARATUS AND CONTROL METHOD OF SUBSTRATE PROCESSING APPARATUS

CROSS-REFERENCE TO RELATED APPLICATIONS

This application is based upon and claims the benefit of priority from Japanese Patent Application No. 2016-048526, filed on Mar. 11, 2016; the entire contents of which are incorporated herein by reference.

FIELD

Embodiments described herein relate generally to a substrate processing apparatus and a control method of the substrate processing apparatus.

BACKGROUND

As a substrate processing apparatus continues to process substrates by a processing unit thereof, a need for maintenance of the processing unit may arise. At this time, it is desired to perform the maintenance of the processing unit appropriately and efficiently.

BRIEF DESCRIPTION OF THE DRAWINGS

FIGS. 2A to 2H are diagrams showing the configuration of a manipulator in the embodiment;

FIG. 3 is a flow chart showing a control method of the substrate processing apparatus according to the embodiment;

FIGS. 8A to 8C are cross-sectional views showing the control method of the substrate processing apparatus according to the embodiment.

DETAILED DESCRIPTION

Figure 1A:
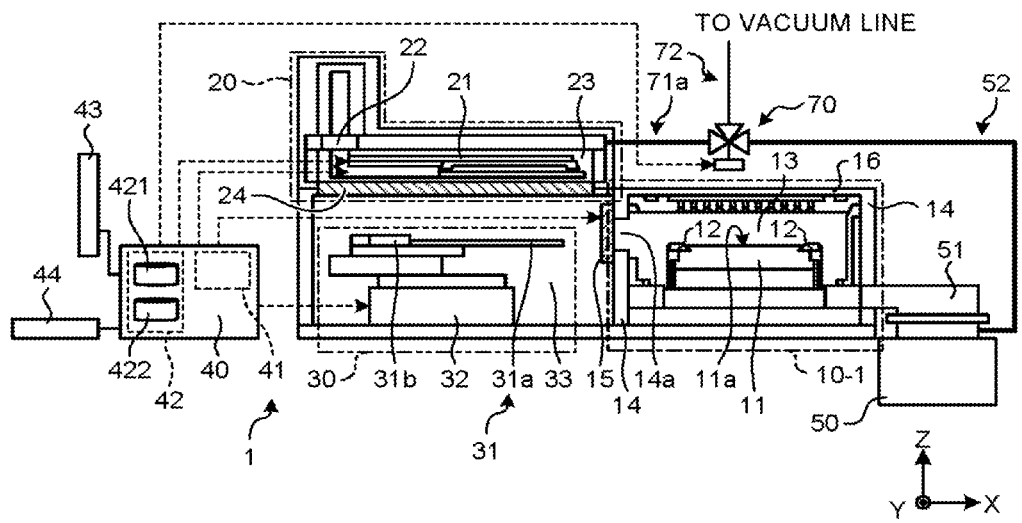
FIGS. 1A, 1B are diagrams showing the configuration of a substrate processing apparatus according to an embodiment.

In general, according to one embodiment, there is provided a substrate processing apparatus including a processing unit and a manipulator. The processing unit processes a substrate. The manipulator is for maintenance. The manipulator is placed near the processing unit.

Exemplary embodiments of a substrate processing apparatus will be explained below in detail with reference to the accompanying drawings. The present invention is not limited to the following embodiments.

Embodiment

A substrate processing apparatus according to the embodiment will be described. In manufacturing a semiconductor device, a variety of processing is performed on a substrate. For example, a diffusion furnace forms predetermined semiconductor regions in the semiconductor; a film forming apparatus forms predetermined films over the substrate; an RIE apparatus performs etching on the predetermined films with predetermined resist patterns as masks; a cleaning apparatus removes the resist patterns. For substrate processing apparatuses such as the diffusion furnace, the film forming apparatus, the RIE apparatus, and the cleaning apparatus, while substrate processing by their processing unit is repeated, the maintenance of the processing unit may be performed.

At this time, for the maintenance of the processing unit, the substrate processing apparatus is made off-line, so that substrate processing is suspended, and thus a burden on the process of manufacturing the semiconductor device (or a shortage of production processing capacity) is likely to become large. For example, if the substrate processing apparatus is a vacuum-based apparatus, it takes a lot of time to make the processing unit exposed to the air before performing maintenance and to evacuate air from the processing unit so as to create a vacuum state in the processing unit after completing the maintenance. For the purpose of reducing the burden imposed by the maintenance on the process of manufacturing the semiconductor device, it is desired to perform the maintenance while maintaining a vacuum state in the processing unit.

Further, if an unskilled person performs it, the maintenance of the processing unit is more likely to be performed inappropriately or inefficiently, depending on individuals, than if a highly skilled person performs it. If a highly skilled person attempts to inform an unskilled person of an appropriate and efficient maintenance method, it is difficult to make it understood, because the maintenance method is largely sensory based. If the maintenance is performed inappropriately, production yields of semiconductor devices are likely to decrease, and if the maintenance is performed inefficiently, the outage time when the substrate processing apparatus is off-line becomes longer, so that throughput is likely to decrease greatly. In either case, the cost of the semiconductor devices may increase.

Further, depending on the semiconductor device to be manufactured, novel materials may be used while enough information about their safety is not available. In this case, reaction products of the novel materials, additives not disclosed by the material maker, or the like may harm human bodies, so that there is concern about the safety of manual maintenance work.

Accordingly, in the present embodiment, a manipulator for maintenance is placed near the processing unit in the substrate processing apparatus, and the maintenance is automated by making the manipulator operate according to operational information of the manipulator from the highly skilled person or so on, so that the maintenance can be made appropriately and efficiently.

Figure 1B:
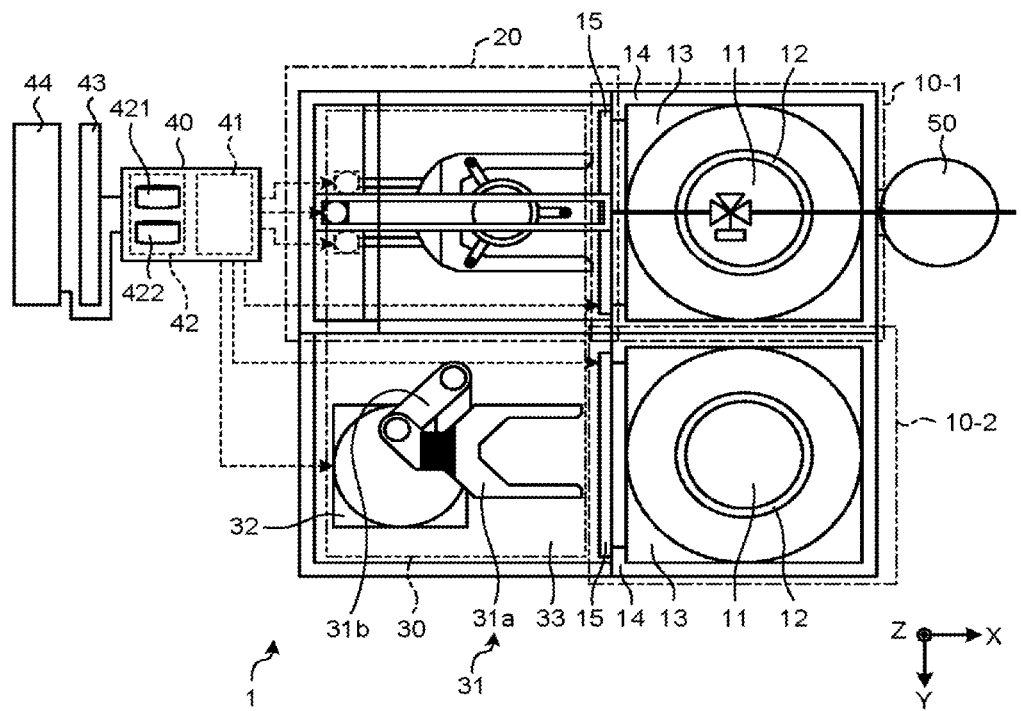

Specifically, as shown in FIGS. 1A, 1B, the substrate processing apparatus 1 has a multi-chamber configuration so as to have multiple processing units 10-1, 10-2, a maintenance unit 20, and a transport unit 30. FIG. 1A is a cross-sectional view showing the configuration of the substrate processing apparatus 1. FIG. 1B is a plan view showing the configuration of the substrate processing apparatus 1. In FIGS. 1A and 1B, let a Z direction be a direction perpendicular to a mounting surface 11a on which to mount a substrate and X and Y directions be two orthogonal directions in a plane perpendicular to the Z direction.

The transport unit 30 transports substrates. The transport unit 30 transports substrates into the processing units 10 and out of the processing units 10. The transport unit 30 has a transfer arm 31, a support box 32, and a transfer chamber 33. The transfer arm 31 has a hand 31a and an arm 31b. The arm 31b has link members rotatably coupled by a motor, and by bending and stretching the link members, the hand 31a can be moved along the X direction. The support box 32 can move along the Y direction and move to the −X side of the processing unit 10 into/out of which to transfer a substrate from among the processing units 10-1, 10-2.

Each processing unit 10 processes substrates. Where the substrate processing apparatus 1 is an RIE apparatus, the processing unit 10 performs etching on substrates. The processing unit 10 has a substrate stage 11, an edge ring 12, a processing chamber 13, a side wall 14, a top wall 16, and a shutter 15. The upper surface of the substrate stage 11 forms the mounting surface 11a on which to mount a substrate. The substrate stage 11 is provided with a holding mechanism such as an electrostatic chuck mechanism (not shown). The edge ring 12 is provided to fit the substrate stage 11 at the side of the mounting surface 11a in cross-sectional view and is placed around the periphery of the mounting surface 11a in plan view. The processing chamber 13 has formed therein a space surrounded by the side wall 14, top wall 16, and shutter 15, out of which to be able to evacuate air via an outlet pipe 51 by a vacuum unit 50 so as to create a vacuum. An opening 14a is formed in part (e.g., the −X side) of the side wall 14. The shutter 15 opens/closes the opening 14a according to the control of a controller 40.

It should be noted that, although FIGS. 1A, 1B illustrate the case where the controller 40 is provided outside the substrate processing apparatus 1, the controller 40 may be provided inside the substrate processing apparatus 1. The controller 40 has a CPU 41, a database 42, a display 43, and an input interface 44.

In the processing unit 10, a substrate is transferred in by the transport unit 30 and placed on the mounting surface 11a. While the processing chamber 13 has had a process gas introduced therein, plasma is generated in the region between the top wall 16 and the substrate stage 11 in the processing chamber 13, so that ions (e.g., $F^+$, $CF_3^+$, etc.) together with radicals are generated from the process gas. When a bias voltage is applied to the substrate stage 11 or the like, a potential difference (electric field) occurs between the plasma and the substrate stage 11, and ions (e.g., $F^+$, $CF_3^+$, etc.) generated in the plasma region are pulled into the substrate, so that etching the substrate (e.g., anisotropic etching) is performed.

The edge ring 12 is provided to adjust the electric field between plasma and the substrate stage 11 so as not to deflect the periphery of the substrate with respect to the Z direction (a direction perpendicular to the substrate surface). The edge ring 12 may be etched during substrate etching and thus is a part of the processing unit 10 which is likely to degrade. If the etching of the edge ring 12 progresses beyond a permissible range, it can reach a timing when the edge ring 12 should be replaced.

Further, even if it has not reached a timing when the edge ring 12 should be replaced, unwanted substances may stick to the edge ring 12 or the substrate stage 11 due to the etching of substrates. If unwanted substances are left sticking to the edge ring 12 or the substrate stage 11, the unwanted substances may then stick to the substrate to cause pattern formation defects when a substrate is being processed, or the vacuum unit 50 may suck in the unwanted substances to cause a failure of the vacuum unit 50.

Accordingly, the maintenance unit 20 performs the maintenance of the processing unit 10. The maintenance unit 20 has a manipulator 21 for maintenance, a drive mechanism 22, a load lock chamber 23 for maintenance, and a shutter 24. The shutter 24 opens/closes the opening between the load lock chamber 23 and the transfer chamber 33. Walls forming the load lock chamber 23 can be configured, together with the manipulator 21 for maintenance and drive mechanism 22, to be movable along the Y direction.

The manipulator 21 is placed near the processing unit 10 and can be accommodated in the load lock chamber 23 so as not to interfere with the transfer arm 31 nor the support box 32. The load lock chamber 23 is placed adjacent to the transfer chamber 33. Although FIGS. 1A, 1B illustrate a configuration where the load lock chamber 23 is placed on the +Z side of, and adjacent to, the transfer chamber 33, the load lock chamber 23 may be placed on the −Z side of, and adjacent to, the transfer chamber 33.

The manipulator 21 performs maintenance work for parts in the processing unit 10 according to the control of the controller 40. The manipulator 21 performs multiple processes in the maintenance work. The maintenance work includes the work of replacing parts in the processing unit 10 with new ones or the work of cleaning parts in the processing unit 10.

For example, in the work of replacing a part (e.g., the edge ring 12) in the processing unit 10, the manipulator 21 performs a first process, a second process, and a third process sequentially according to the control of the controller 40. The first process, second process, and third process can be performed while the substrate has been transferred out of the processing unit 10. The first process is a process of moving at least portion(s) of the manipulator 21 into the processing unit 10. The second process is a process of holding the part in the processing unit 10 by means of portion(s) moved into the processing unit 10 (the moved portion(s) may include the at least tip portion of the manipulator 21). The third process is a process of moving the part out of the processing unit 10 and transferring the part into the load lock chamber 23 for maintenance. The load lock chamber 23 has formed therein a space out of which to be able to evacuate air to create a vacuum state via an outlet pipe 71a, three-way valve 70, and outlet pipe 52 by the vacuum unit 50.

Alternatively, for example, in the work of cleaning a part (e.g., the edge ring 12 or substrate stage 11) in the processing unit 10, the manipulator 21 performs a first process and a fourth process sequentially according to the control of the controller 40. The first process and fourth process can be performed while the substrate has been transferred out of the processing unit 10. The first process is a process of moving at least portion(s) of the manipulator 21 into the processing unit 10. The fourth process is a process of cleaning the part in the processing unit 10 by means of the portion(s) of the manipulator 21 moved into the processing unit 10.

More specifically, the manipulator 21 is configured as shown in FIGS. 2A to 2H. FIGS. 2A to 2H are diagrams showing the configuration of the manipulator 21.

The manipulator 21 has a transfer arm (first arm) 21a, a suction cleaning arm (second arm) 21b, and a rail 21c as shown in FIGS. 2A, 2B. FIG. 2A is a plan view showing the transfer arm 21a, the suction cleaning arm 21b, and the rail 21c. FIG. 2B is a side view showing the transfer arm 21a, the suction cleaning arm 21b, and the rail 21c. The transfer arm 21a and the suction cleaning arm 21b are combined via the rail 21c. The rail 21c is fixed to the walls forming the load lock chamber 23. The transfer arm 21a and the suction cleaning arm 21b, combined together, can be accommodated in the load lock chamber 23 for maintenance. The transfer arm 21a and the suction cleaning arm 21b are configured to be movable along the Z and X directions independently of each other. The rail 21c has a configuration where two rails extending in the X direction with keeping a substantially constant distance along the Y direction are joined at opposite ends by bars extending in the Y direction.

The transfer arm 21a has a hand 21a1, arms 21a2, 21a3, and drive elements 21a4, 21a5 as shown in FIGS. 2C, 2D. FIG. 2C is a plan view slowing the transfer arm 21a and the rail 21c. FIG. 2D is a side view showing the transfer arm 21a and the rail 21c. The drive elements 21a4, 21a5 and the rail 21c form, e.g., a linear drive mechanism in which the rail 21c functions as a stator while the drive elements 21a4, 21a5 function as a mover. Of the drive elements 21a4, 21a5 (the mobile) and the rail 21c (the stator), one has a movable mechanism constituted by a slider or the like, and the other has a drive mechanism (linear actuator). The controller 40 controls a current supplied to the linear actuator to move the transfer arm 21a along the rail 21c in the X direction.

Further, the drive elements 21a4, 21a5 and the arms 21a2, 21a3 form, e.g., a linear drive mechanism in which the arms 21a2, 21a3 function as a stator while the drive elements 21a4, 21a5 function as a mover. Of the drive elements 21a4, 21a5 (the mover) and the arms 21a2, 21a3 (the stator), one has a movable mechanism constituted by a slider or the like, and the other has a drive mechanism (linear actuator). The controller 40 controls a current supplied to the linear actuator to move the transfer arm 21a along the Z direction.

The suction cleaning arm 21b has a hand 21b1, an arm 21b2, and a drive element 21b3 as shown in FIGS. 2E, 2F. FIG. 2E is a plan view showing the suction cleaning arm 21b and the rail 21c. FIG. 2F is a side view showing the suction cleaning arm 21b and the rail 21c. The drive element 21b3 and the rail 21c form, e.g., a linear drive mechanism in which the rail 21c functions as a stator while the drive element 21b3 function as a mover. Of the drive element 21b3 (the mover) and the rail 21c (the stator), one has a movable mechanism constituted by a slider or the like, and the other has a drive mechanism (linear actuator). The controller 40 controls a current supplied to the linear actuator to move the suction cleaning arm 21b along the rail 21c in the X direction.

Further, the drive element 21b3 and the arm 21b2 form, e.g., a linear drive mechanism in which the arm 21b2 functions as a stator while the drive element 21b3 functions as a mover. Of the drive element 21b3 (the mover) and the arm 21b2 (the stator), one has a movable mechanism constituted by a slider or the like, and the other has a drive mechanism (linear actuator). The controller 40 controls a current supplied to the linear actuator to move the suction cleaning arm 21b along the Z direction.

The controller 40 can control the drive elements 21a4, 21a5 of the transfer arm 21a and the drive element 21b3 of the suction cleaning arm 21b independently of each other. The manipulator 21 can move the transfer arm 21a and the suction cleaning arm 21b along the X direction independently of each other according to the control of the controller 40. The manipulator 21 can move the transfer arm 21a and the suction cleaning arm 21b along the Z direction independently of each other according to the control of the controller 40.

The hand 21b1 of the suction cleaning arm 21b has suction mechanisms 21b1, cleaning mechanisms 21b12, an imaging element 21b15, fingers 21b13, and a disk 21b14 as shown in FIG. 2G. FIG. 2G is a plan view showing the configuration of the suction cleaning arm 21b. The arm 21b2 of the suction cleaning arm 21b has an annular portion 21b21 and a bar-shaped portion 21b22. The disk 21b14 is held by the annular portion 21b21 to be rotatable around the Z direction. The disk 21b14 has the multiple fingers 21b13 joined thereto and can be rotated according to the control of the controller 40, thereby moving the multiple fingers 21b13 in a direction of rotation around the Z direction. Each of the fingers 21b13 is provided at its end with the suction mechanism 21b11 and cleaning mechanism 21b12.

The imaging element 21b15 is provided in one of the fingers 21b13. Images acquired by the imaging element 21b15 can be displayed on a display 43 of the controller 40. The imaging element 21b15 may detect the depth of focus in acquiring an image of a part in the processing unit 10. The controller 40 can determine the degradation state (how much worn) of the part in the processing unit 10 according to the result of performing image processing or the result of detecting the depth of focus. Or in addition to the imaging element 21b15, a length measuring device (e.g., a laser interferometer) may be provided on the one finger 21b13. In this case, the controller 40 can determine the degradation state (how much worn) of the part in the processing unit 10 according to the result of detecting laser light interference fringes.

The suction mechanism 21b11 and cleaning mechanism 21b12 can be configured as shown in FIG. 2H. FIG. 2H is a cross-sectional view showing the configuration of the suction mechanism 21b11 and cleaning mechanism 21b12. The suction mechanism 21b11 can be configured as an open end of the outer pipe of a double pipe 71d. The outer pipe of the double pipe 71d is rotatably joined by a joint 71c to the outer pipe of the double pipe 71b with keeping the quality of being sealed. That is, air can be expelled from the outer pipe of the double pipe 71d to a vacuum line via the joint 71c, the outer pipe of the double pipe 71b, the outlet pipe 71a, the three-way valve 70, and an outlet pipe 72. Thus, the suction mechanism 21b11 can suck and hold a part (e.g., the edge ring 12) in the processing unit 10.

The cleaning mechanism 21b12 can be configured as an open end of the inner pipe of the double pipe 71d. The inner pipe of the double pipe 71d is rotatably joined by the joint 71c to the inner pipe of the double pipe 71b with keeping the quality of being sealed. The cleaning mechanism 21b12 can supply, for example, powder particles of dry ice from a dry ice supply source to the inner pipe of the double pipe 71d via a supply pipe 71g, the inner pipe of the double pipe 71b, and the joint 71c. Thus, the cleaning mechanism 21b12 can blow the powder particles of dry ice onto a part (e.g., the edge ring 12 or substrate stage 11) in the processing unit 10 for cleaning (dry ice cleaning). For example, unwanted substances sticking to the edge ring 12 or substrate stage 11 can be pulled off the edge ring 12 or substrate stage 11 when powder particles of dry ice sublime after sticking to the unwanted substances. The unwanted substances pulled off the edge ring 12 or substrate stage 11 can be expelled by the suction mechanism 21b11 to the vacuum line.

Figure 4A:
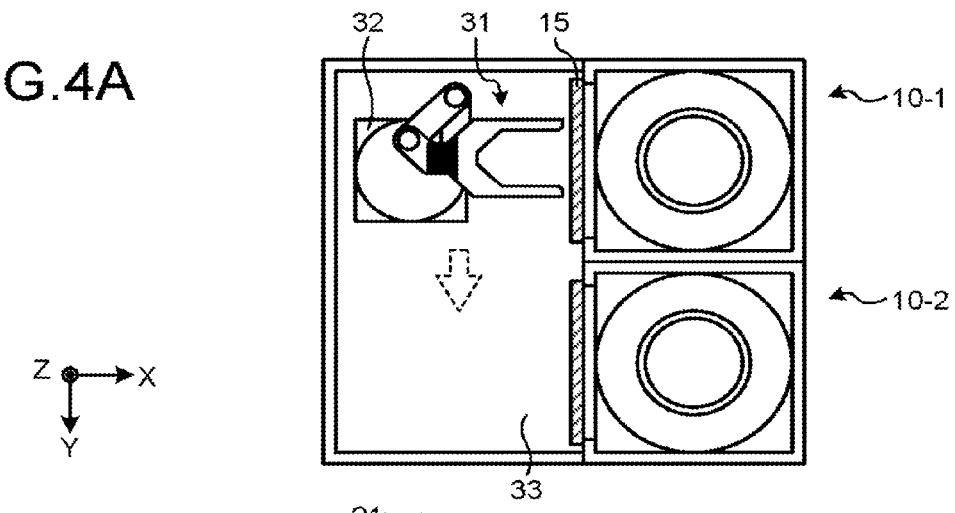
FIGS. 4A to 4C are plan views showing the control method of the substrate processing apparatus according to the embodiment.
Figure 4B:
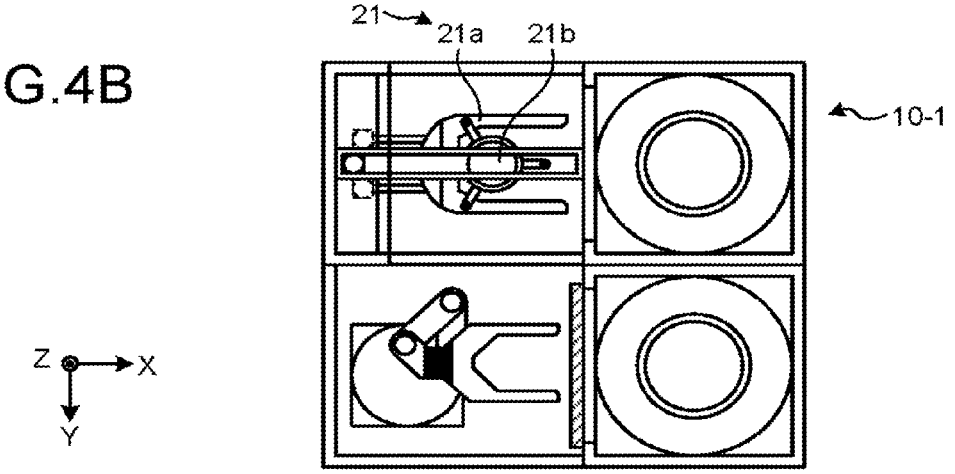
Figure 4C:
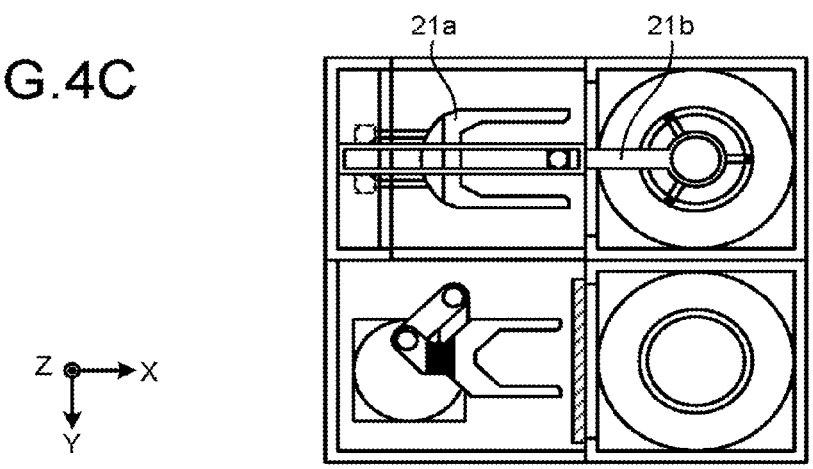

Next, the control method of the substrate processing apparatus 1 will be described using FIGS. 3 to 8C. FIG. 3 is a flow chart showing the control method of the substrate processing apparatus 1. FIGS. 4A to 4C are plan views showing the control method of the substrate processing apparatus 1. FIGS. 5A to 8C are cross-sectional views showing the control method of the substrate processing apparatus 1.

Figure 5A:
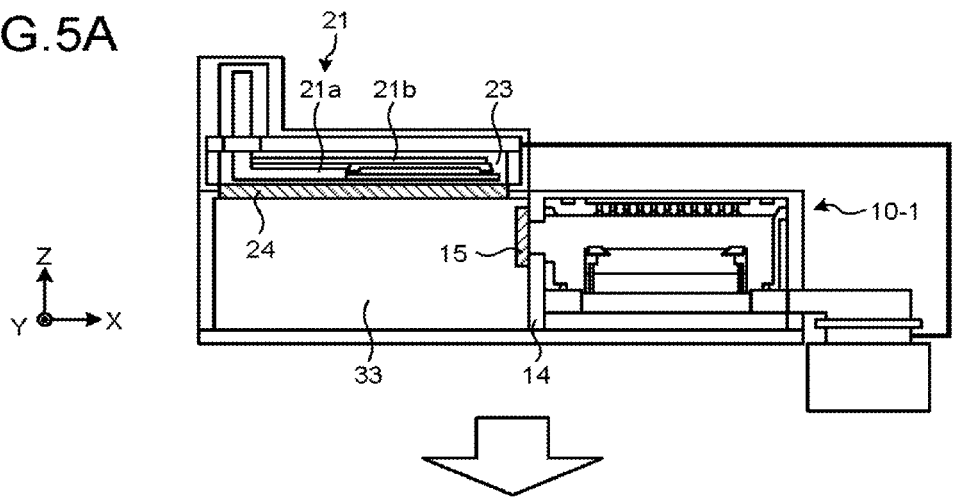
FIGS. 5A to 5C are cross-sectional views showing the control method of the substrate processing apparatus according to the embodiment.
Figure 5B:
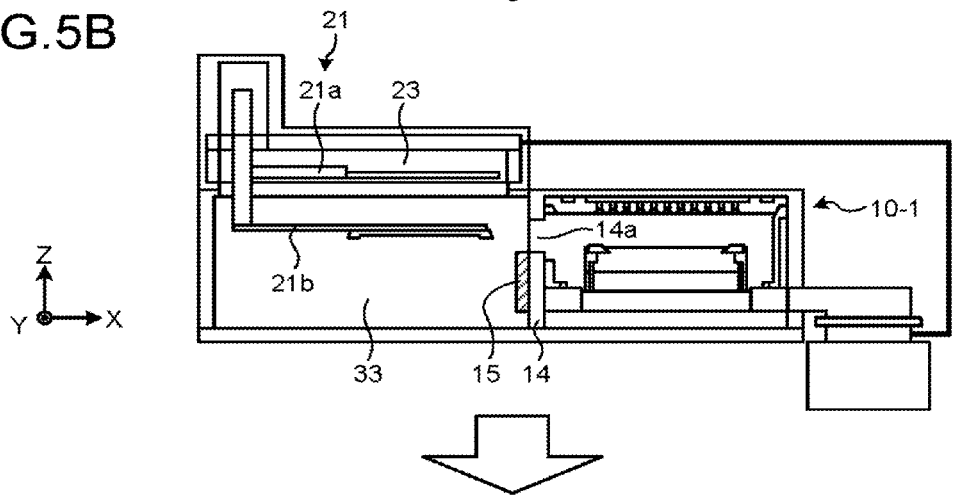
Figure 5C:
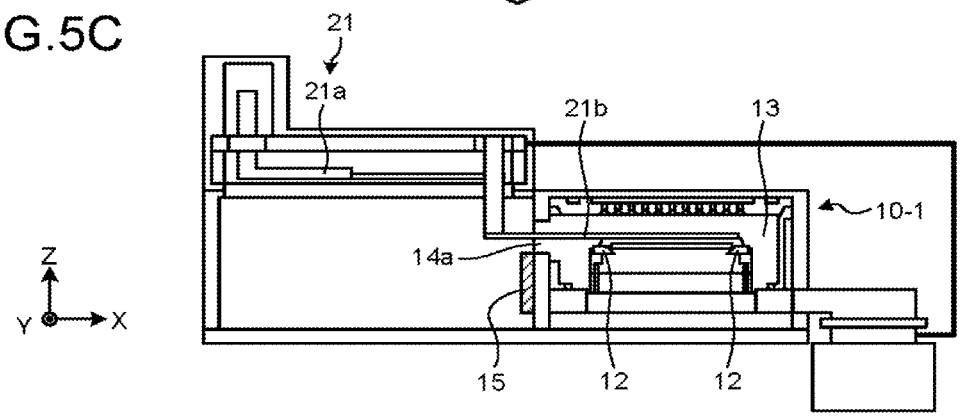
Figure 6A:
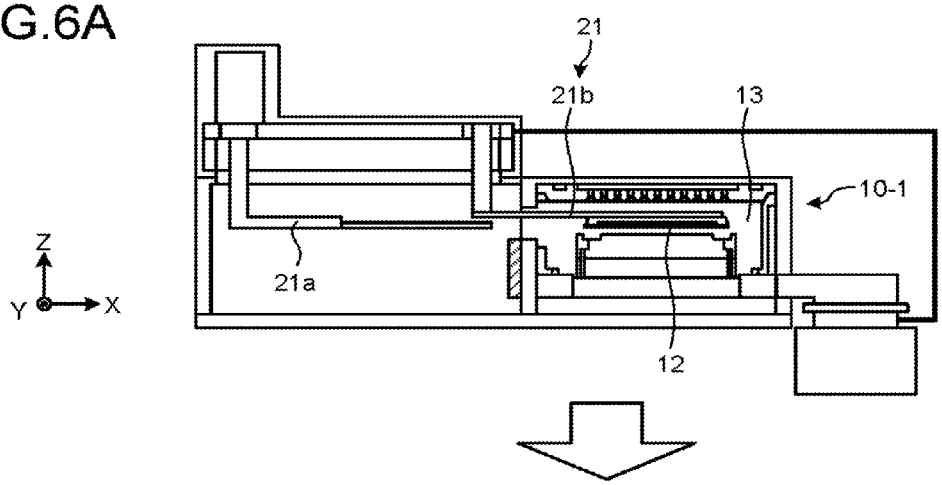
FIGS. 6A to 6C are cross-sectional views showing the control method of the substrate processing apparatus according to the embodiment.
Figure 6B:
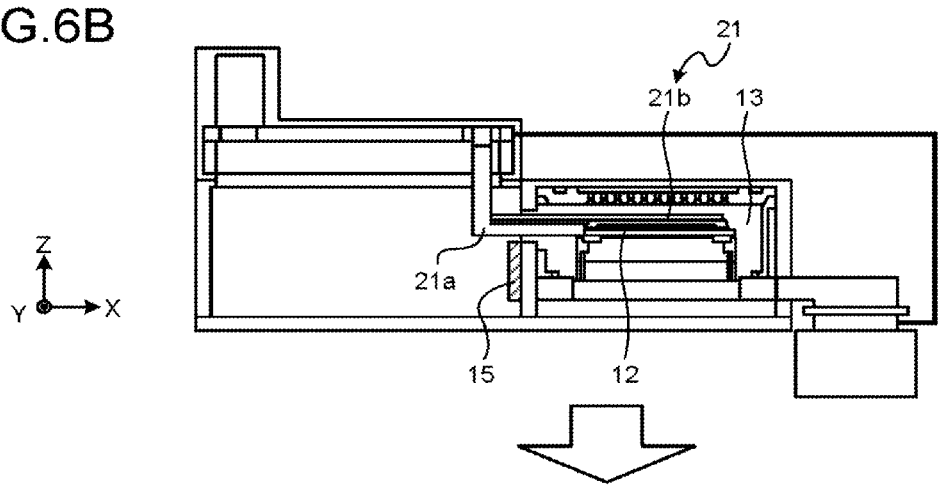
Figure 6C:
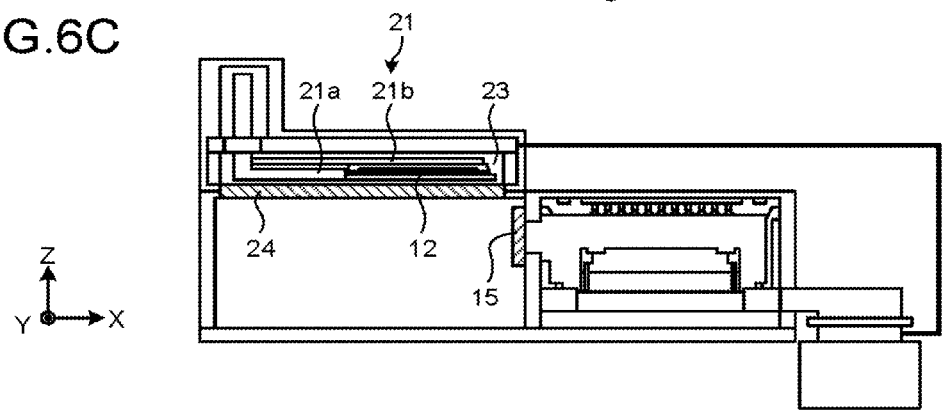

When the substrate processing apparatus 1 is made offline, and the maintenance of the processing unit 10-1 is started (S1), the transfer arm 31 and the support box 32 are moved in the +Y direction inside the transfer chamber 33 and evacuated from the −X side of the processing unit 10-1 (see FIGS. 4A, 5A). At this time, the transfer arm 21a and the suction cleaning arm 21b of the manipulator 21 are housed in the load lock chamber 23 for maintenance.

The shutter 15 opens the opening 14a in the side wall 14 of the processing unit 10-1 according to the control of the controller 40. After the shutter 24 is made open so that the load lock chamber 23 for maintenance and the transfer chamber 33 are open to each other, the manipulator 21 selectively moves the suction cleaning arm 21b in the −Z direction according to the control of the controller 40 (see FIGS. 4B, 5B).

The substrate processing apparatus 1 monitors the state of a part in the processing unit 10-1 (S2). That is, after the suction cleaning arm 21b reaches the Z position of the opening 14a, the manipulator 21 moves the suction cleaning arm 21b in the +X direction so that tip portion of the arm is located inside the processing chamber 13 according to the control of the controller 40 (see FIGS. 4C, 5C). The manipulator 21 acquires information about the lifetime of a part (e.g., the edge ring 12) via the imaging element 21b15 (see FIG. 2G) provided at the tip portion of the suction cleaning arm 21b according to the control of the controller 40. This information may be, for example, an acquired image of the surface of a part (e.g., the edge ring 12), or the result of detecting the depth of focus when acquiring an image of the surface of the part (e.g., the edge ring 12), or the result of detecting laser light interference fringes.

The controller 40 receives the image information acquired by the manipulator 21 (the imaging element 21b15) to store as information indicating the state of the part into the database 42 (S3). The controller 40 analyzes the degradation state of the part (e.g., how much worn the edge ring 12 is) based on the image information (S4) and determines whether the part has reached its lifetime, that is, whether the part should be replaced (S5).

For example, where the image information is an image of the surface of the part, the controller 40 can quantify how rough the surface of the part is into a numerical value by performing image processing or so on and determine that the part has reached its lifetime when the numerical value indicating how rough, exceeds a permissible value. Or where the information is the result of detecting the depth of focus, the controller 40 can identify how much worn the surface of the part is (a reduction in thickness) from the result of detecting the depth of focus and determine that the part has reached its lifetime when the reduction in thickness exceeds a permissible value. Or where a laser interferometer is provided on the manipulator 21, the controller 40 can identify how much worn the surface of the part is (the amount of wear) from the result of detecting laser light interference fringes and determine that the part has reached its lifetime when the amount of wear exceeds a permissible value.

When the part has not reached its lifetime, that is, when the part should not be replaced (OK at S5), the manipulator 21 performs cleaning on the part according to the control of the controller 40 (S6). For example, the three-way valve 70 (see FIG. 1A) switches from the state of the outlet pipe 52 and outlet pipe 71a communicating to the state of the outlet pipe 72 and outlet pipe 71a communicating according to the control of the controller 40. The manipulator 21, according to the control of the controller 40, has the cleaning mechanism 21b12 blow powder particles of dry ice onto the processing unit 10 side (such as the substrate stage 11) to clean (dry ice clean) and has the suction mechanism 21b11 expel unwanted substances to the vacuum line. After the cleaning finishes, the three-way valve 70 (see FIG. 1A) switches back from the state of the outlet pipe 72 and outlet pipe 71a communicating to the state of the outlet pipe 52 and outlet pipe 71a communicating according to the control of the controller 40. The manipulator 21 acquires an image of the part in the processing unit 10 via the imaging element 21b15 (see FIG. 2G) according to the control of the controller 40. If it is determined that the cleanness state of the part has reached a desired state of cleanness according to the image of the part, the maintenance is finished (S7).

When the part has reached its lifetime, that is, when the part should be replaced (NG at S5), the substrate processing apparatus 1 accesses operational information 421 (see FIGS. 1A, 1B) stored in the database 42 of the controller 40 to acquire the operational information 421 associated with the type of the part and the work "removal of the part" (S9). The substrate processing apparatus 1 has the manipulator 21 operate according to the acquired operational information 421 so as to remove the part (S8). The operational information 421 includes information about the position of the transfer arm 21a, the position of the suction cleaning arm 21b, the operation speed of the transfer arm 21a, the operation speed of the suction cleaning arm 21b, and the sucking force of the suction cleaning arm 21b, which information is associated with the type of the part and the work "removal of the part".

For example, the manipulator 21 has the tip portion of the suction cleaning arm 21b suck and hold the part (e.g., the edge ring 12) in the processing unit 10-1 (see FIG. 6A) according to the control of the controller 40. The manipulator 21 hands the part from the suction cleaning arm 21b onto the transfer arm 21a (see FIG. 6B) and transfers the part into the load lock chamber 23 for maintenance by the transfer arm 21a and closes the shutters 15, 24 (see FIG. 6C).

If it is determined that the manipulator 21 failed in removing the part according to an image acquired by the imaging element 21b15, displayed on the display 43, or the like (NG at S10), the controller 40 switches the operation of the manipulator 21 from operation according to the control of the controller 40 to operation according to manual operation. The controller 40 receives operation instructions from a user (highly skilled person) via the input interface 44 (S11) and generates operation correction values to correct the operational information 421 of the manipulator 21 according to the operation instructions (S12). The controller 40 acquires the operational information 421 associated with the work "removal of the part" (S9) from the database 42 and corrects the acquired operational information 421 according to the operation correction values to store the corrected operational information 421 into the database 42. The substrate processing apparatus 1 again acquires the operational information 421 stored in the database 42 of the controller 40 (S9) and has the manipulator 21 operate according to the operational information 421 so as to remove the part (S8).

If it is determined that the manipulator 21 succeeded in removing the part according to an image acquired by the imaging element 21b15, displayed on the display 43, or the like (OK at S10), the load lock chamber 23 is opened to the atmosphere with the shutter 24 being kept closed, and the part is taken out. The manipulator 21 performs cleaning on the processing unit 10 side (such as the substrate stage 11) according to the control of the controller 40 (S13).

For example, the shutter 15 opens the opening 14a in the side wall 14 of the processing unit 10-1 according to the control of the controller 40. The manipulator 21 opens the shutter 24 and moves the suction cleaning arm 21b in the −Z direction according to the control of the controller 40. After the suction cleaning arm 21b reaches the Z position of the opening 14a, the manipulator 21 moves the suction cleaning arm 21b in the +X direction so that the tip portion of the arm is located inside the processing chamber 13 (see FIG. 7A). The three-way valve 70 (see FIG. 1A) switches from the state of the outlet pipe 52 and outlet pipe 71a communicating to the state of the outlet pipe 72 and outlet pipe 71a communicating according to the control of the controller 40. The manipulator 21, according to the control of the controller 40, has the cleaning mechanism 21b12 blow powder particles of dry ice onto the processing unit 10 side (such as the substrate stage 11) to clean (dry ice clean) and has the suction mechanism 21b11 expel unwanted substances to the vacuum line. After the cleaning finishes, the three-way valve 70 (see FIG. 1A) switches back from the state of the outlet pipe 72 and outlet pipe 71a communicating to the state of the outlet pipe 52 and outlet pipe 71a communicating according to the control of the controller 40.

The substrate processing apparatus 1 monitors the state of the processing unit 10 side (such as the substrate stage 11) (S14). That is, the manipulator 21 acquires an image of the processing unit 10 side (such as the substrate stage 11) via the imaging element 21b15 (see FIG. 2G) according to the control of the controller 40.

The controller 40 receives the image of the processing unit 10 side acquired by the manipulator 21 (the imaging element 21b15) to store as information indicating the cleanness state of the processing unit 10 side into the database 42 (S15). The controller 40 analyzes the state of the processing unit 10 side based on the information indicating the cleanness state (S16) and determines whether the state of the processing unit 10 side has reached a desired state of cleanness (S17).

If the state of the processing unit 10 side has not reached the desired state of cleanness (NG at S17), the manipulator 21 again performs cleaning on the processing unit 10 side (such as the substrate stage 11) according to the control of the controller 40 (S13) and monitors the state of the processing unit 10 side (such as the substrate stage 11) (S14).

Figure 7A:
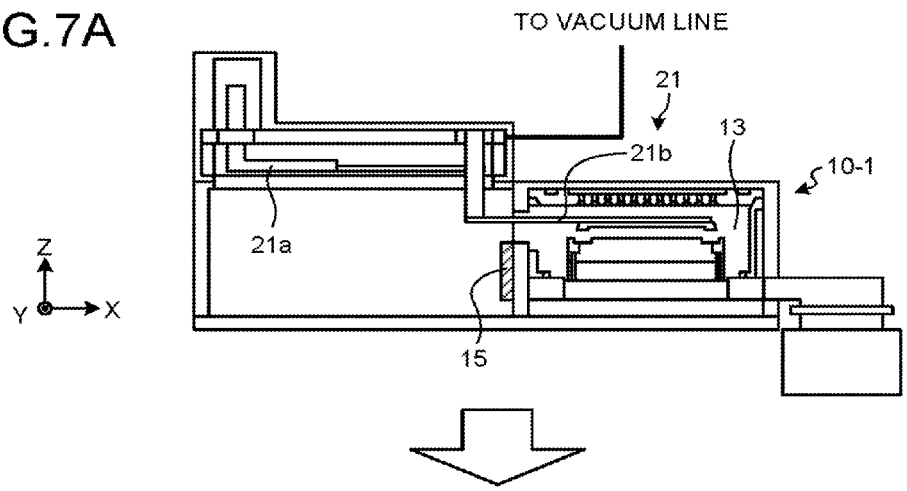
FIGS. 7A to 7C are cross-sectional views showing the control method of the substrate processing apparatus according to the embodiment.
Figure 7B:
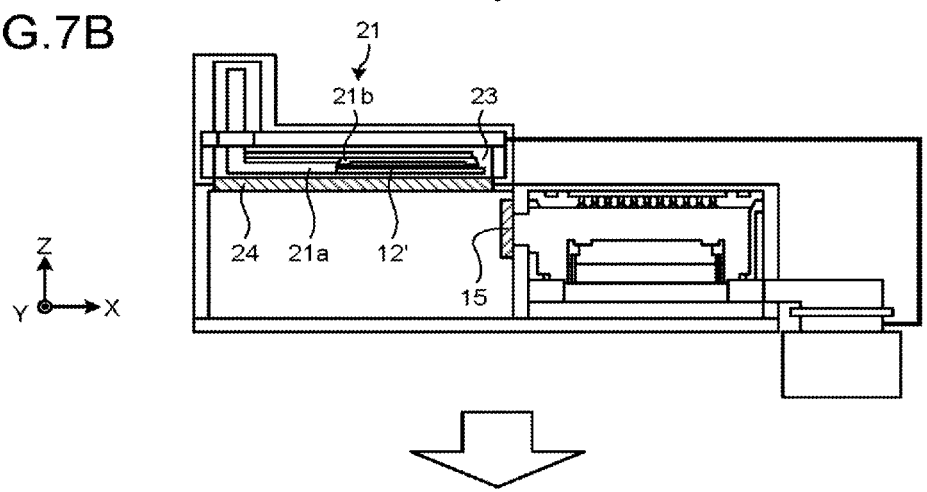
Figure 7C:
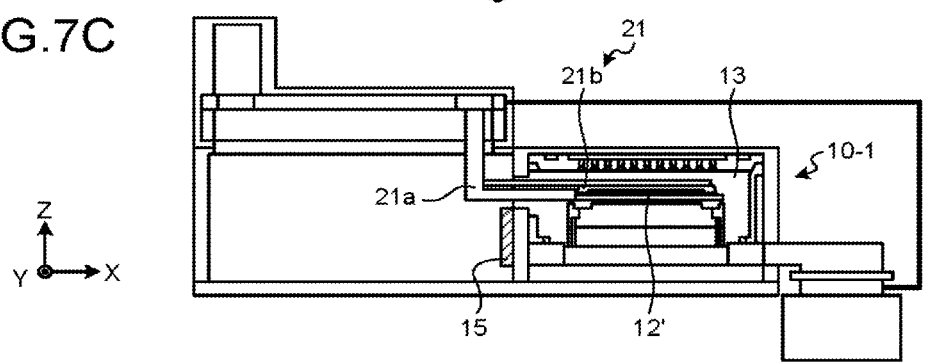

If the state of the processing unit 10 side has reached the desired state of cleanness (OK at S17), the load lock chamber 23 is opened to the atmosphere with the shutter 24 being kept closed, and a new part (e.g., an edge ring 12′) is mounted onto the manipulator 21 (the transfer arm 21a), and air is evacuated out of the load lock chamber 23 to create a vacuum state (see FIG. 7B).

The substrate processing apparatus 1 accesses operational information 421 stored in the database 42 of the controller 40 to acquire the operational information 421 associated with the type of the part and the work "installation of the part" (S19). The substrate processing apparatus 1 has the manipulator 21 operate according to the acquired operational information 421 so as to install the part (S18). The operational information 421 includes information about the position of the transfer arm 21a, the position of the suction cleaning arm 21b, the operation speed of the transfer arm 21a, the operation speed of the suction cleaning arm 21b, and the sucking force of the suction cleaning arm 21b, which information is associated with the type of the part and the work "installation of the part".

For example, the manipulator 21 transfers the part into the processing unit 10-1 by the transfer arm 21a according to the control of the controller 40. The manipulator 21 makes the tip portion of the transfer arm 21a and the tip portion of the suction cleaning arm 21b be located inside the processing chamber 13. The manipulator 21 has the suction cleaning arm 21b suck and hold the part mounted on the transfer arm 21a (see FIG. 7C) and moves the transfer arm 21a in the −X direction to be evacuated from the processing chamber 13 while suction cleaning arm 21b is holding the part by suction (see FIG. 8A). The manipulator 21 has the suction cleaning arm 21b stop holding by suction so as to install the part (e.g., the edge ring 12′) in the processing unit 10-1 (see FIG. 8B). Then the manipulator 21 moves the suction cleaning arm 21b in the −X direction to be evacuated from the processing chamber 13 and moves the transfer arm 21a and the suction cleaning arm 21b in the +Z direction to be housed in the load lock chamber 23 for maintenance and closes the shutter (see FIG. 8C).

If it is determined that the manipulator 21 failed in installing the part according to an image acquired by the imaging element 21b15, displayed on the display 43, or the like (NG at S20), the controller 40 switches the operation of the manipulator 1 from operation according to the control of the controller 40 to operation according to manual operation. The controller 40 receives operation instructions from a user (highly skilled person) via the input interface 44 (S21) and generates operation correction values to correct the operational information 421 of the manipulator 21 according to the operation instructions (S22). The controller 40 corrects the operational information 421 stored in the database 42 according to the operation correction values to store the corrected operational information 421 into the database 42. The substrate processing apparatus 1 again acquires the operational information 421 stored in the database 42 of the controller 40 (S19) and has the manipulator 21 operate according to the operational information 421 so as to install the part (S18).

If it is determined that the manipulator 21 succeeded in installing the part according to an image acquired by the imaging element 21b15, displayed on the display 43, or the like (OK at S20), the substrate processing apparatus 1 is made on-line, so that the maintenance of the processing unit 10-1 is finished (S23).

As described above, in the embodiment, the manipulator 21 for maintenance is placed near the processing unit 10 in the substrate processing apparatus 1. The manipulator 21 can perform maintenance on the processing unit 10 according to the control of the controller 40. Thus, the maintenance of the processing unit 10 can be automated, and, where the substrate processing apparatus 1 is a vacuum-based apparatus, maintenance can be performed with keeping a vacuum in the processing unit 10, so that the burden imposed by maintenance on the process of manufacturing a semiconductor device can be reduced. That is, the maintenance of the processing unit 10 can be performed appropriately and efficiently.

Further, in the embodiment, in the substrate processing apparatus 1, the manipulator 21 can perform maintenance of the processing unit 10 according to the operational information 421 corrected through operation of a highly skilled person. Thus, appropriate and efficient maintenance of the processing unit 10 can be easily achieved, which maintenance can be of similar level to that performed by a highly skilled person, and hence production yields of semiconductor devices can be improved, and the outage time when the substrate processing apparatus 1 is off-line can be shortened, so that throughput can be improved.

Yet further, in the embodiment, in the substrate processing apparatus 1, the manipulator 21 can perform maintenance of the processing unit 10 according to the control of the controller 40. That is, the maintenance of the processing unit 10 can be automated, and hence the safety of maintenance work can be easily secured.

It should be noted that, although in FIG. 3 it is determined whether a part in the processing unit 10 should be replaced by monitoring the part to acquire the degradation state (information about the lifetime) of the part, it may be determined whether a part should be replaced according to integration time of substrate processing since completion of preceding maintenance by the substrate processing apparatus 1. That is, if the integration time of substrate processing is shorter than a predetermined time, it is determined that the part should not be replaced, and if the integration time of substrate processing is longer than the predetermined time, it is determined that the part should be replaced. In this case, the suction cleaning arm 21b of the manipulator 21 need not have the imaging element 21b15.

The controller 40 may use operational information 421 obtained by making the manipulator 21 operate according to operation instructions from a user (highly skilled person) as information for making the manipulator 21 of another substrate processing apparatus operate. In this case, as to the tool matching between the substrate processing apparatus (substrate processing tool) 1 and other substrate processing apparatuses (other substrate processing tools), the controller 40 may acquire, e.g., information about a deviation in a reference position or the like as tool matching information 422 to store the acquired tool matching information 422 into the database 42 (see FIGS. 1A, 1B). In this case, the controller 40 can correct the operational information 421 with use of the tool matching information 422 and make the manipulator 21 of the other substrate processing apparatus operate according to the corrected operational information 421. Thus, for each of the substrate processing apparatus 1 and the other substrate processing apparatus, the maintenance of the processing unit 10 can be performed appropriately and efficiently.

Although the embodiment has taken the edge ring 12 as an example of the part in the processing unit 10 to perform maintenance on, the part to be subject to maintenance is not limited to the edge ring 12 but may be another part of the processing unit 10 which can degrade (such as an O-ring or a not-shown quarts-made window provided in part of the side wall 14).

Although the embodiment illustrates the case where the substrate processing apparatus 1 is an RIE apparatus, the concept of the present embodiment can also be applied to the case where the substrate processing apparatus 1 is another apparatus to process substrates. For example, in the case where the substrate processing apparatus 1 is a diffusion furnace or a film forming apparatus, the above description can also apply. In the case where the substrate processing apparatus 1 is a cleaning apparatus, by means of replacing the term "processing chamber" in the description with a term "processing bath", the above description can also apply.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A substrate processing apparatus comprising:
a processing unit to process a substrate; and
a manipulator for maintenance, the manipulator being placed near the processing unit,
wherein the manipulator includes:
a first arm; and
a second arm combined with the first arm,
the manipulator causes the first arm and the second arm to move independently of each other according to control of a controller;
the substrate processing apparatus further comprises a load lock chamber for maintenance that can accommodate the first arm and the second arm;
wherein the manipulator, according to control of the controller, causes at least a tip portion of the second arm to move into the processing unit for the tip portion to suck a part in the processing unit and causes the first arm and the second arm to hand the part from the second arm onto the first arm and to transfer the part with the first arm into the load lock chamber.

2. The substrate processing apparatus according to claim 1, further comprising a transport unit placed near the processing unit, the transport unit including a transfer arm.

3. The substrate processing apparatus according to claim 1, wherein
the manipulator performs maintenance work on a part in the processing unit according to control of a controller.

4. The substrate processing apparatus according to claim 3, wherein
the manipulator performs multiple processes in the maintenance work.

5. The substrate processing apparatus according to claim 3, wherein
the maintenance work includes a work of replacing the part or a work of cleaning the part.

6. The substrate processing apparatus according to claim 4, wherein
the multiple processes include:
a first process of moving at least one portion of the manipulator into the processing unit;
a second process of holding the part by the at least one portion; and
a third process of transferring the part by the manipulator.

7. The substrate processing apparatus according to claim 4, wherein
the multiple processes include:
a first process of moving at least one portion of the manipulator into the processing unit; and
a fourth process of cleaning the part by the at least one portion.

8. The substrate processing apparatus according to claim 1, wherein
the second arm has a suction mechanism that can suck and hold a part in the processing unit.

9. The substrate processing apparatus according to claim 8, wherein
the second arm further has an imaging element that can acquire an image of the part.

10. The substrate processing apparatus according to claim 1, wherein
the second arm has a cleaning mechanism that can clean a part in the processing unit.

11. The substrate processing apparatus according to claim 1, wherein the manipulator, according to control of the controller, causes at least a tip portion of the second arm to move into the processing unit and causes the tip portion to clean a part in the processing unit.

* * * * *